United States Patent
Ding et al.

(10) Patent No.: US 11,644,513 B1
(45) Date of Patent: May 9, 2023

(54) REAL-TIME AC-IMPEDANCE INSPECTION USING LIMITED-ENERGY ON-BOARD AC EXCITATION FOR BATTERY MANAGEMENT SYSTEM

(71) Applicant: Hong Kong Applied Science and Technology Research Institute Company Limited, Hong Kong (HK)

(72) Inventors: Wenlong Ding, Hong Kong (HK); Meng Chen, Hong Kong (HK); Yaofeng Sun, Hong Kong (HK); Manxin Chen, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 17/570,527

(22) Filed: Jan. 7, 2022

(51) Int. Cl.
*G01R 31/389* (2019.01)
*H02J 7/00* (2006.01)
(Continued)

(52) U.S. Cl.
CPC ........ *G01R 31/389* (2019.01); *G01R 31/367* (2019.01); *G01R 31/392* (2019.01); *H02J 7/005* (2020.01); *H02J 7/0068* (2013.01); *H02J 7/00711* (2020.01); *H02J 7/345* (2013.01); *H02M 3/04* (2013.01)

(58) Field of Classification Search
None
See application file for complete search history.

(56) References Cited

U.S. PATENT DOCUMENTS

| 10,386,422 B2 | 8/2019 | Christensen et al. |
| 10,992,144 B2 | 4/2021 | Li et al. |

(Continued)

FOREIGN PATENT DOCUMENTS

| CN | 103884995 A | 6/2014 |
| CN | 105391116 A | 3/2016 |

(Continued)

OTHER PUBLICATIONS

ISR and Written Opinion, PCT/CN2022/082519, dated Sep. 21, 2022.

Primary Examiner — Jas A Sanghera
(74) Attorney, Agent, or Firm — gPatent LLC; Stuart T. Auvinen

(57) ABSTRACT

A Battery Management System (BMS) inspects a battery pack using AC impedance. A controller on the BMS drives a Pulse-Width Modulation (PWM) output signal to an on-board excitation regulator such as a synchronous buck converter that modulates a limited energy unit such as a capacitor with a swept frequency of a PWM input signal. The capacitor modulations are applied to a terminal of the battery pack as an AC excitation signal. Synchronous sampling of the battery pack provides responses to the AC excitation signal. An AC excitation signal current and a battery response voltage are processed and Fourier-transformed to generate a Nyquist plot of the excitation-response data. Curve shifts can indicate worn battery cells. The capacitor generating the AC excitation signal draws little energy from the battery pack so AC impedance inspection can occur during all modes: charging, discharging, and idle modes without an external power supply.

18 Claims, 15 Drawing Sheets

(51) Int. Cl.
  *H02J 7/34*      (2006.01)
  *G01R 31/392*    (2019.01)
  *G01R 31/367*    (2019.01)
  *H02M 3/04*      (2006.01)

(56) References Cited

U.S. PATENT DOCUMENTS

| | | | |
|---|---|---|---|
| 2013/0057221 A1* | 3/2013 | Shibata | H02J 7/00306 |
| | | | 320/136 |
| 2017/0003354 A1* | 1/2017 | Morrison | G01R 31/3842 |
| 2018/0203073 A1 | 7/2018 | Christensen et al. | |
| 2021/0391741 A1 | 12/2021 | Rigdon et al. | |

FOREIGN PATENT DOCUMENTS

| | | |
|---|---|---|
| CN | 112630674 A | 4/2021 |
| CN | 114731053 A | 7/2022 |
| WO | WO 2019010585 A | 1/2019 |

* cited by examiner

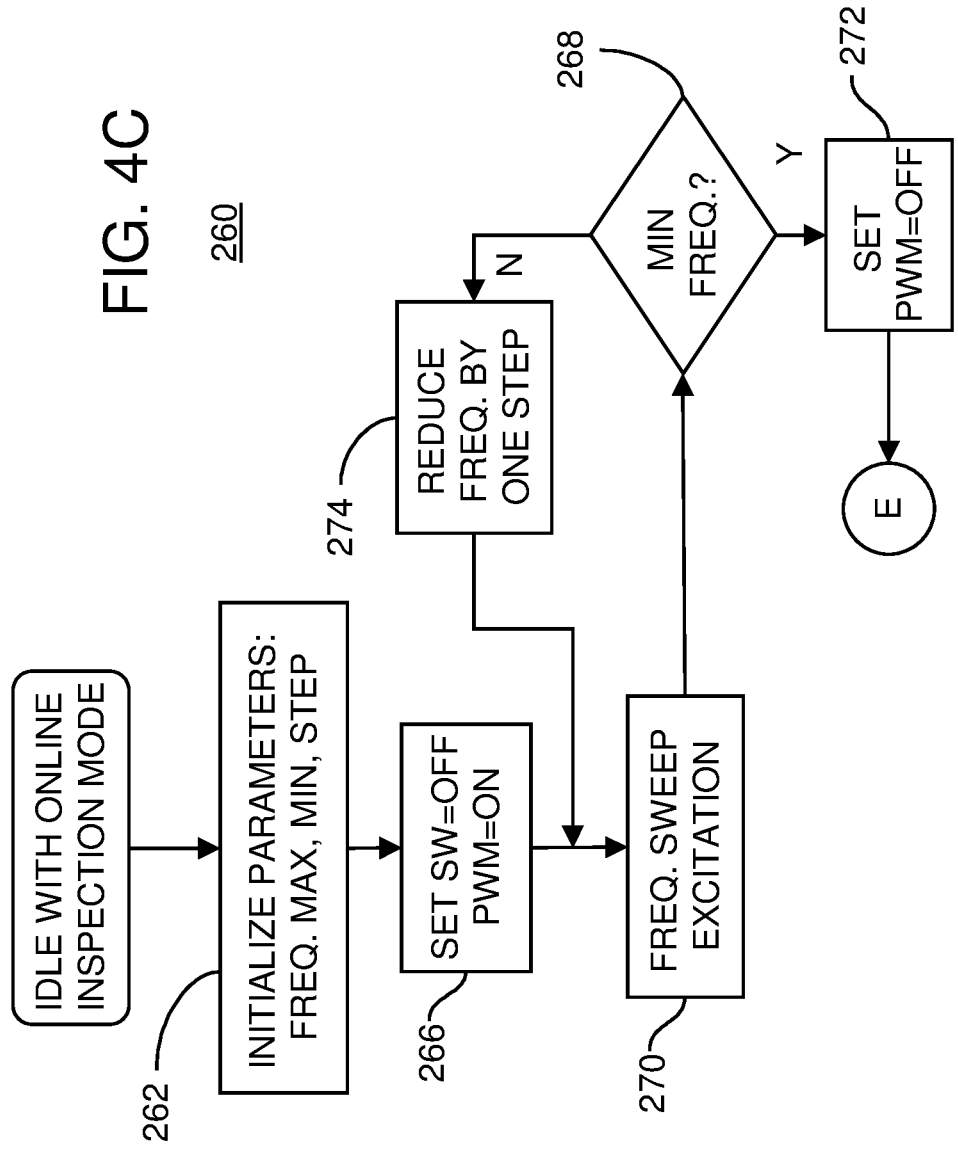

280

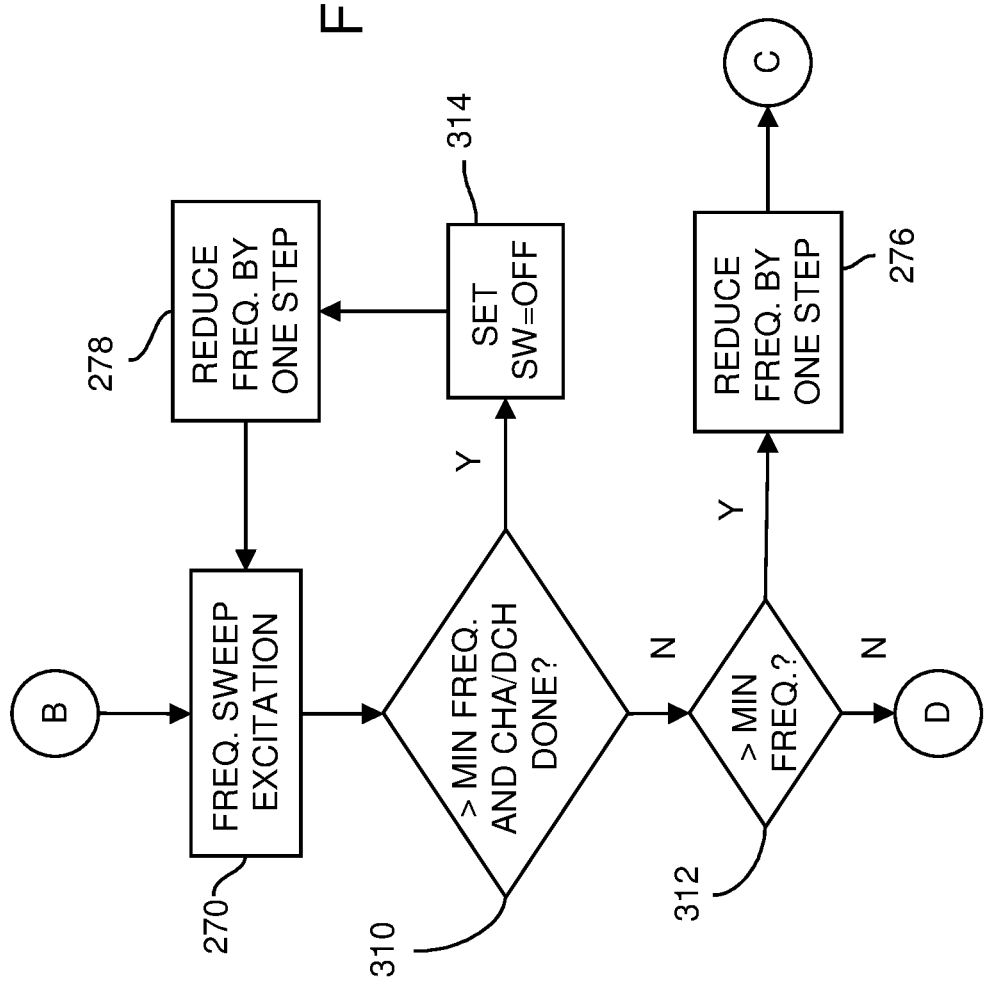

280

REAL-TIME AC-IMPEDANCE INSPECTION USING LIMITED-ENERGY ON-BOARD AC EXCITATION FOR BATTERY MANAGEMENT SYSTEM

FIELD OF THE INVENTION

This invention relates to battery management systems, and more particularly for AC Impedance inspection of batteries in real time.

BACKGROUND OF THE INVENTION

Larger systems such as Electric Vehicle (EV) are powered by battery packs that are managed by a Battery Management System (BMS) that controls charging and discharging of the battery pack. The BMS may also have an idle mode wherein the battery pack is disconnected from both the charging source and the load.

The BMS may monitor the health or aging of the battery pack. An auxiliary charger or power supply may generate an Alternating Current (AC) signal that is applied to the battery to measure its impedance. Some of these AC inspection systems only operate when the battery is being charged by the charger during the charging mode when power is available. More recently, an external power supply has been used for battery inspection during the idle mode.

While these battery inspection systems are useful, a real-time battery-inspection system is desired that can operate and inspect the battery in all three modes: charging, discharging, and idle. For example, it is desired to perform AC impedance inspection on an EV battery while the EV is running (discharge mode), being charged (charging mode), and while the EV is sitting idle without either charging or discharging (idle mode). Such a real-time online inspection system could detect battery problems earlier without having to wait for charging mode to occur. For example, a damaged battery cell that occurred when a rock punctured the battery pack while driving, or by a vandal when an EV is parked and not being charged could be detected without having to wait for the EV to be connected to a charger at a later time.

During battery inspection, an AC excitation signal is generated and applied to the battery pack so that the BMS or inspection system can observe the response of the battery pack to the AC excitation signal. This AC excitation signal can be generated using power from the charger during charging mode. Unfortunately for discharging mode and idle mode, the charger may not be available, so an external power supply is needed to generate the AC excitation signal during discharge and idle modes. This external power supply is undesirable.

It is desired to generate the AC excitation signal without an external power supply or a charger. The battery pack itself could supply power, but it is undesirable to draw a large amount of power from the battery pack since this drains the battery pack. Some AC impedance inspection systems have a large Direct Current (DC) component, and this large DC component can cause a large current drain from the power source. If the battery were used as the power source for such an AC excitation signal, the large DC component could excessively drain the battery.

It is desired to generate the AC excitation signal using power stored from the battery pack without drawing a large amount of power from the battery pack. Generating the AC excitation signal from a limited amount of energy in a storage unit is desired so that only a limited amount of energy is drawn from the battery pack. A real-time AC impedance battery-inspection system that can operate in all modes, charge, discharge, and idle, is desirable.

BRIEF DESCRIPTION OF THE DRAWINGS

FIGS. 4A-4F show a BMS process that performs battery inspection using an AC excitation signal to examine AC impedance of the battery.

DETAILED DESCRIPTION

The present invention relates to an improvement in AC impedance inspection of batteries. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
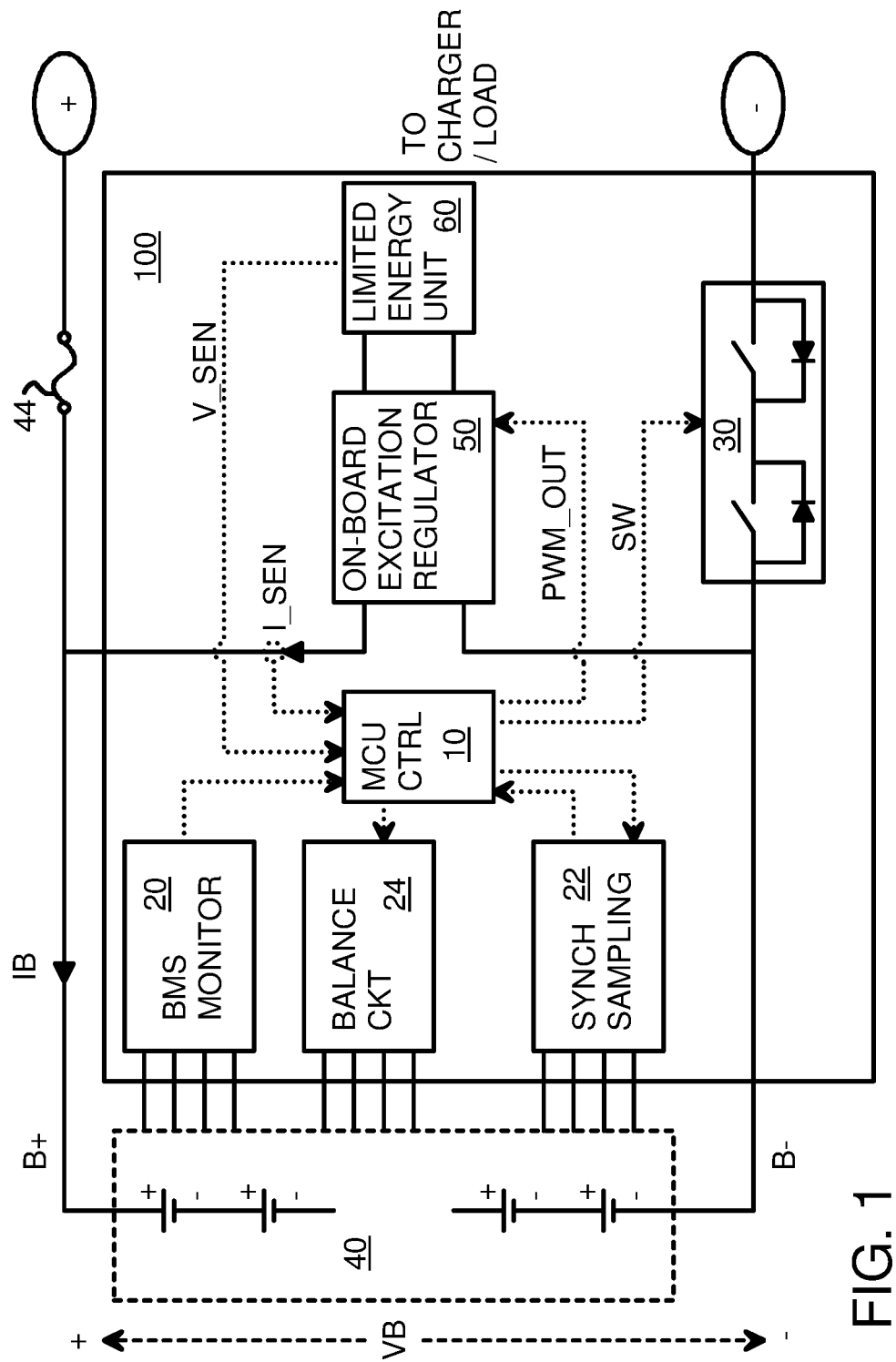
FIG. 1 is a block diagram of a Battery Management System (BMS) with an on-board AC impedance battery inspector.

FIG. 1 is a block diagram of a Battery Management System (BMS) with an on-board AC impedance battery inspector. Battery pack 40 has several battery modules or cells in series between battery terminals B+ and B−, with a battery voltage VB between battery terminals B+, B−.

When an external charger is attached to external terminals +, −, battery pack 40 is charged by battery current IB that flows from the + charger terminal, through fuse 44 and into battery terminal B+ when power switch 30 is closed by switch signal SW, allowing return current to flow from battery terminal B−, through power switch 30, to the external terminal connected to the external charger. This is charging mode when Microcontroller Unit (MCU) 10 drives switch SW high and the charger is connected to external terminals +, −.

During discharge mode, the load such as the EV engine is connected to external terminals +, − and MCU 10 drives SW high to turn on power switch 30. Then battery pack 40 drives the load with current from battery terminal B+ through fuse 44 to external terminal + to the load, and with a return current from the load through external terminal −, through power switch 30 to battery terminal B−.

During idle mode, MCU 10 drives switch SW low, turning off power switch 30 and preventing current flow from battery pack 40 to the − external terminal.

BMS monitor 20 can monitor battery pack 40, such as by receiving voltage, current, and temperature signals generated by battery pack 40.

BMS may control battery pack 40 using balance circuit 24 that can signal battery pack 40 to equalize battery module or cell voltages within battery pack 40 through a passive or active balance circuit. In some systems balance circuit 24 may be able to disconnect or bypass battery modules or cells in battery pack 40. Battery modules or cells that are damaged or that have aged thus can be disconnected in some systems.

Synchronous sampling 22 samples the overall battery voltage VB and current IB and may also be able to sample internal nodes within battery pack 40, such as by receiving voltages of internal nodes within battery pack 40. Synchronous sampling 22 performs sampling synchronously and more accurately than BMS monitor 20 and can check internal voltages of battery modules within battery pack 40, such as modules in series between battery pack terminals B+ and B−.

MCU 10 can execute various control routines that control BMS monitor 20, synchronous sampling 22, and balance circuit 24 to monitor signals generated by battery pack 40. MCU 10 also executes a battery inspection routine that generates an AC excitation signal that is applied to battery pack 40 to perform AC impedance inspection.

During or before AC impedance inspection, MCU 10 instructs on-board excitation regulator 50 to draw a small amount of energy from battery pack 40 through battery terminals B+, B− to charge limited energy unit 60. Then the small amount of energy stored in limited energy unit 60 is used by on-board excitation regulator 50 to generate an AC excitation signal that has a frequency controlled by a Pulse-Width Modulation (PWM) signal that on-board excitation regulator 50 receives from MCU 10.

The AC excitation signal generated by on-board excitation regulator 50 is sense current I_SEN, which is controlled by the PWM_OUT signal. The AC excitation signal I_SEN flows into battery terminal B+ and modifies any battery current IB that is flowing during charge or discharge mode. During idle mode, I_SEN is the only current, so I_SEN=IB.

MCU 10 monitors the applied AC excitation current I_SEN and the voltage V_SEN from limited energy unit 60 and compares this applied AC signal to the response from battery pack 40, such as changes to VB or internal voltages from synchronous sampling 22. Synchronous sampling 22 can detect small and fast changes to voltages caused by the small AC signal of the AC excitation signal I_SEN that is added to the DC charging or discharging current.

From the applied AC excitation signal I_SEN and the voltage response of battery pack 40, MCU 10 can plot the impedance of battery pack 40 for different frequencies of I_SEN. This impedance plot can be used to detect battery problems such as loose or disconnected internal connectors, or cell inconsistencies within a battery pack. The impedance plot can estimate the health or aging of battery modules or cells within battery pack 40.

Figure 2:
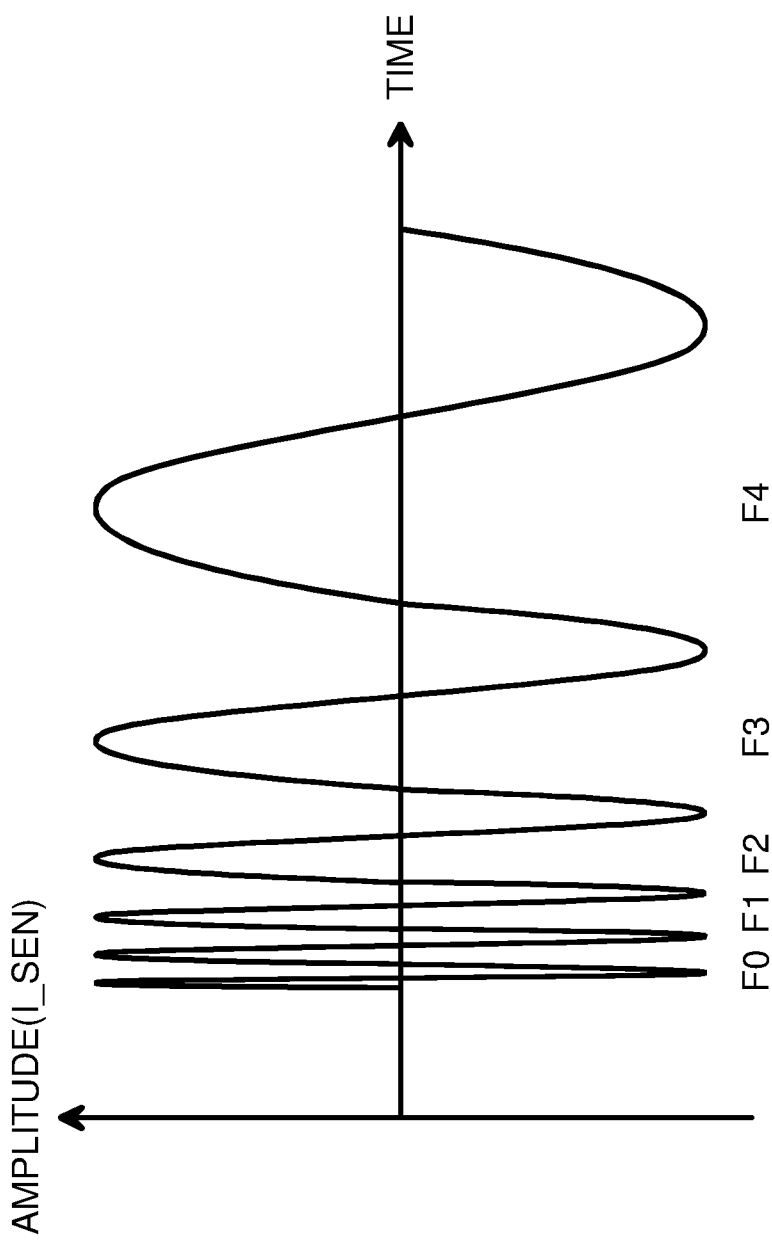
FIG. 2 is a graph of the AC excitation signal applied to the battery pack.

FIG. 2 is a graph of the AC excitation signal applied to the battery pack. The amplitude of the AC excitation signal I_SEN generated by on-board excitation regulator 50 (FIG. 1) is shown over time. MCU 10 sets PWM signal on and drives PWM_IN to a PWM modulator which outputs PWM_OUT at a fixed frequency much higher than that of PWM_IN and causes on-board excitation regulator 50 to drive I_SEN at an initial frequency F0 that is synchronized to PWM_IN.

MCU 10 gradually steps down the frequency of PWM_IN, causing AC excitation signal I_SEN to decrease in frequency from F0 to next frequency F1, then F2, F3, and a final slowest frequency F4. In an actual system, there may be more than four frequency steps, such as 20, 40, 50, etc. Battery pack 40 will have different responses to the different frequencies F0, F1, F2, ... F4. Voltage VB and current IB of the battery pack are sensed and sampled by synchronous sampling 22, and the battery impedances for different frequency points can be calculated by MCU 10 according to Ohm's law.

Figure 3:
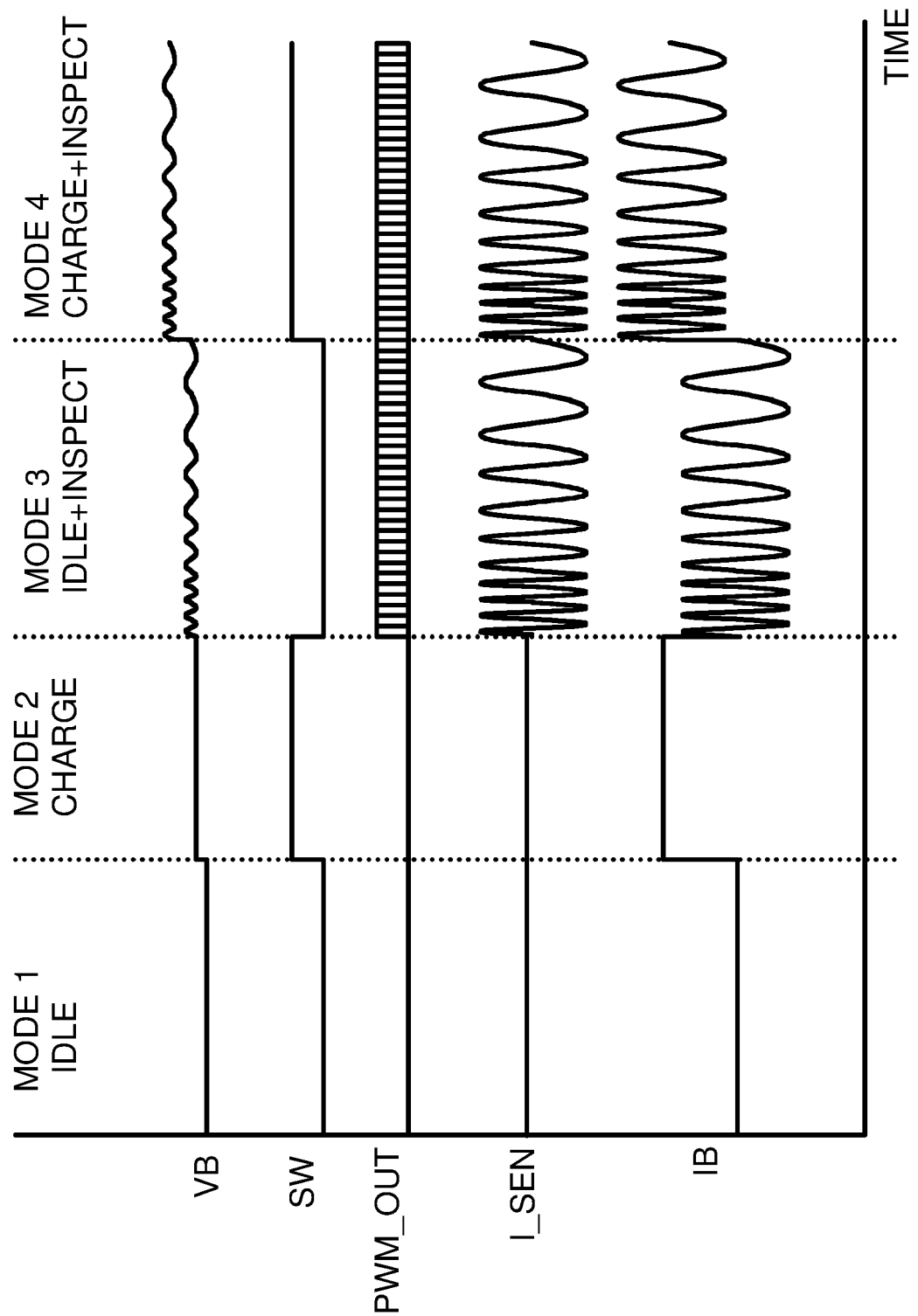
FIG. 3 is a waveform diagram of operation of the BMS system of FIG. 1.

FIG. 3 is a waveform diagram of operation of the BMS system with AC impedance inspection of FIG. 1 in different operating modes. In mode 1, idle mode, the battery is not connected to the charger or to the load, and AC impedance testing is not performed. The battery voltage VB remains constant while SW is off to disconnect the charger and load. PWM_IN or another control signal is disabled to prevent the PWM modulator from pulsing PWM_OUT, so there is no AC excitation signal I_SEN generated. No battery current IB flows.

In mode 2, charge/discharge mode, SW is driven high to connect battery pack 40 to the external charger or load. A battery current IB flows. However, PWM does not pulse and no AC excitation signal I_SEN is generated since AC impedance testing is not being performed in mode 2. During charging the battery voltage VB rises, or falls during discharge.

In mode 3, idle+inspect mode, MCU 10 drives PWM_IN with a frequency that decreases over time, causing on-board excitation regulator 50 to generate AC excitation signal I_SEN that oscillates with a frequency that decreases over time. The period of PWM_OUT is much smaller than the period of I_SEN and is not drawn to scale. SW is off so the battery is disconnected from the load and charger. The only battery current IB is from the AC excitation signal I_SEN. The battery voltage VB fluctuates slightly in response due to the added AC excitation signal and MCU 10 examines these VB fluctuations to estimate the health of battery pack 40 and its internal components.

In mode 4, charge+inspect mode, MCU 10 enables the PWM modulator and drives PWM_IN with a frequency that decreases over time, causing on-board excitation regulator 50 to generate AC excitation signal I_SEN that oscillates with a frequency that decreases over time. The period of PWM_OUT is much smaller than the period of I_SEN and is not drawn to scale. SW is on so the battery is connected to the charger (or the load in a similar discharge+inspect mode).

The battery current IB is the sum of the charger current flowing into the battery plus the AC excitation signal I_SEN. The charger current is a DC current that shifts the AC excitation signal I_SEN upward as shown in the waveform for IB.

The battery voltage VB is shifted upward by charging and is then modulated slightly by the AC excitation signal. MCU 10 examines these VB fluctuations and internal battery nodes to estimate the health of battery pack 40 and its internal components.

Figure 4A:
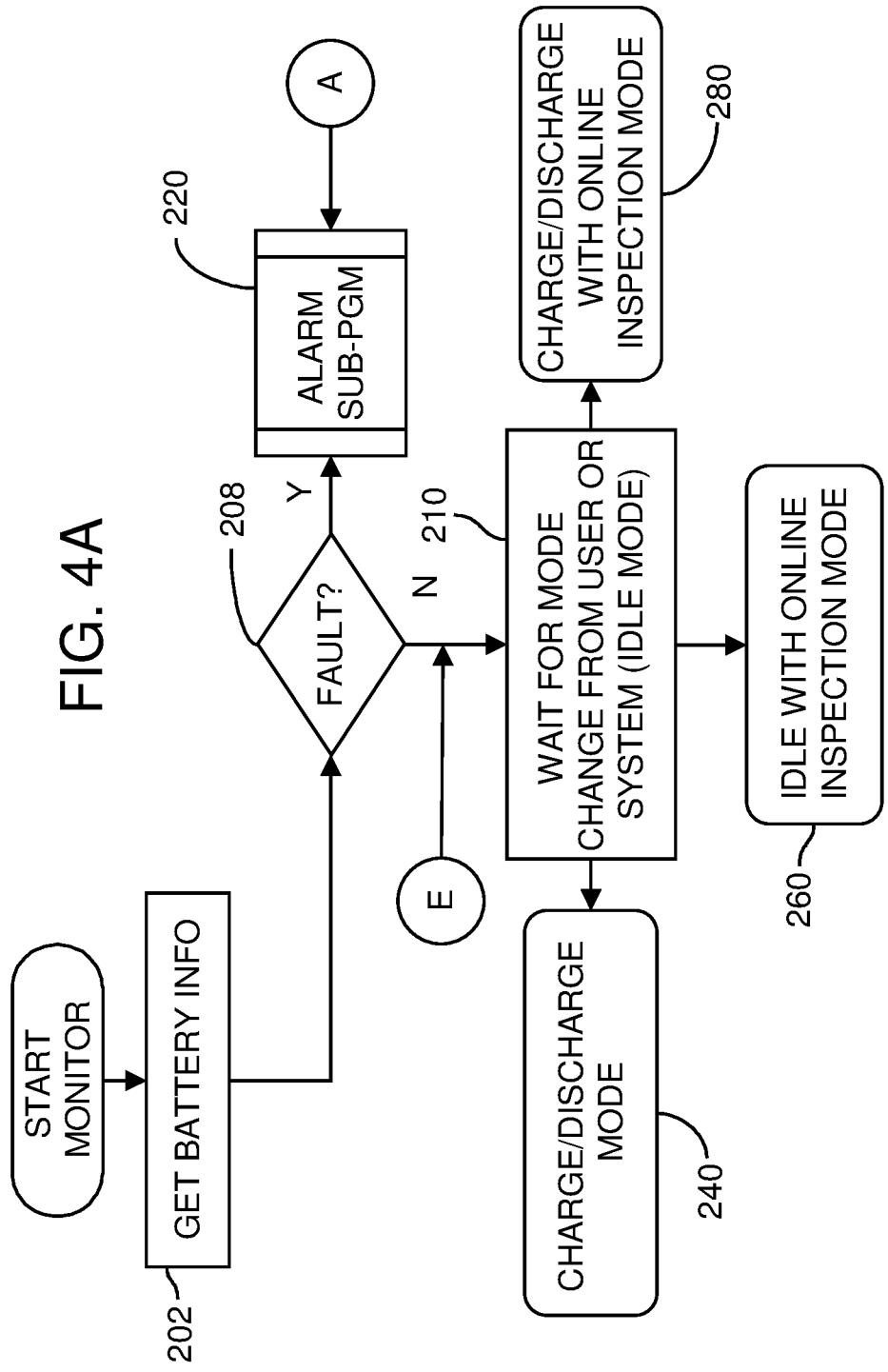

FIGS. 4A-4F show a BMS process that performs battery inspection using an AC excitation signal to examine AC impedance of the battery. In FIG. 4A, when the BMS is initiated, the BMS reads battery information, step 202. This battery information may be stored in battery pack 40 or in a memory device on BMS with AC impedance inspector 100 read by MCU 10. This battery information may include the structure or arrangement of battery cells inside battery pack 40, voltage or current limits, original AC impedance, charge/discharge cycles, and current conditions such as voltage, current, temperature, or an over/under-temperature alarm, an over/under-voltage alarm, over-current alarm, short circuit, or various other faults. The battery information read may include separate fault alarms or a generic fault indicator generated by battery pack 40.

When a fault is detected or reported by battery pack 40, step 208, then alarm sub-program 220 is activated to process the alarm, which may involve turning off switch signal SW and no longer pulsing the PWM signal.

Figure 4B:
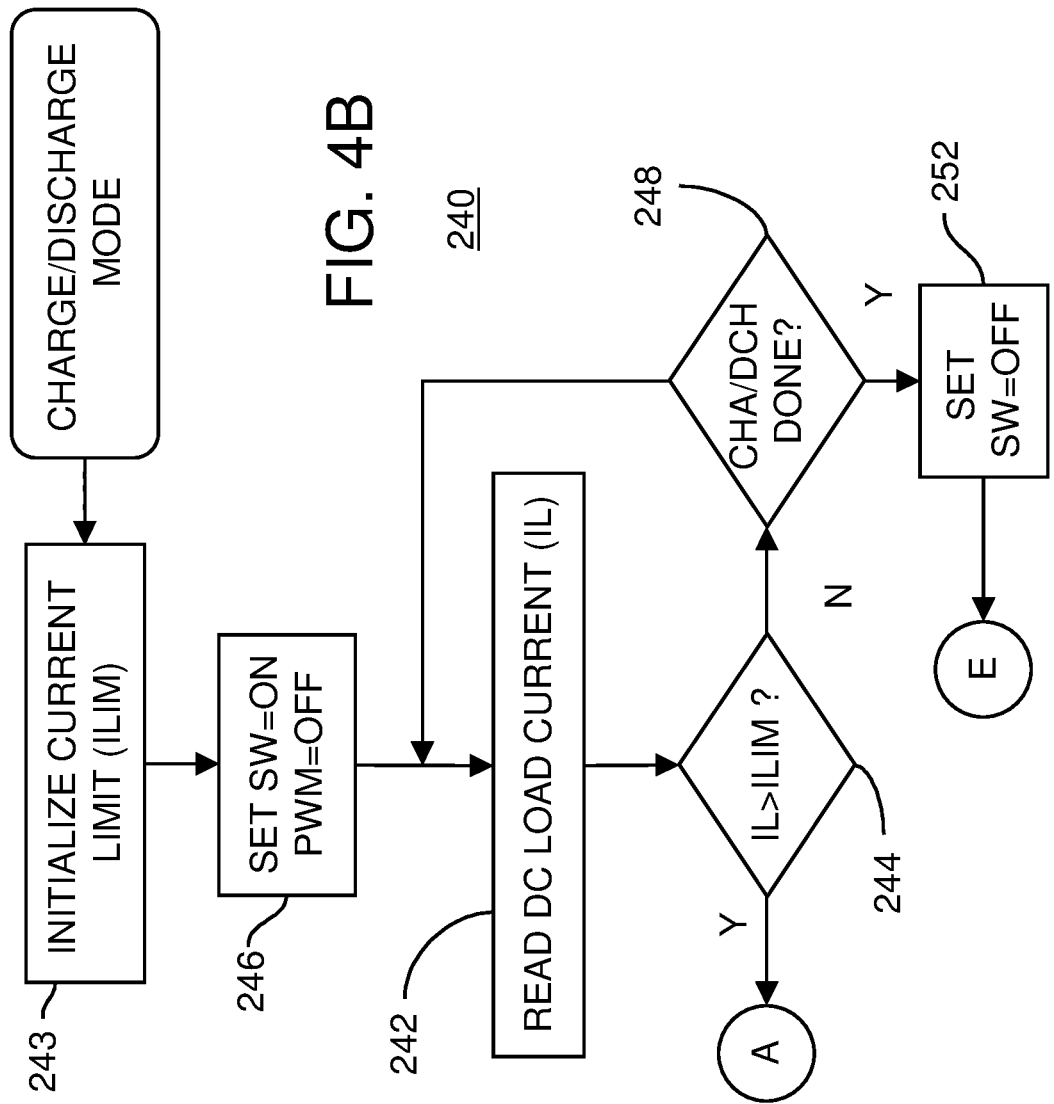
Figure 4D:
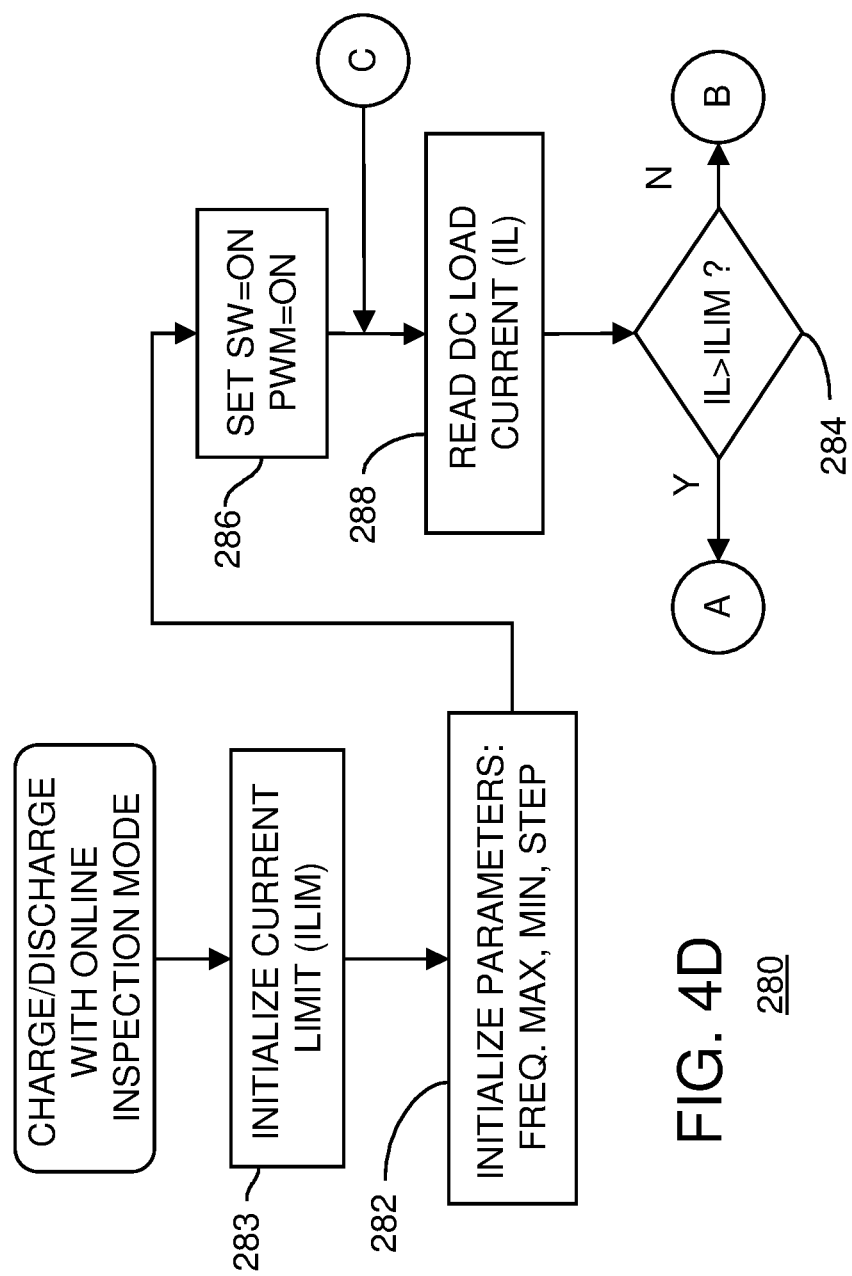
Figure 4F:
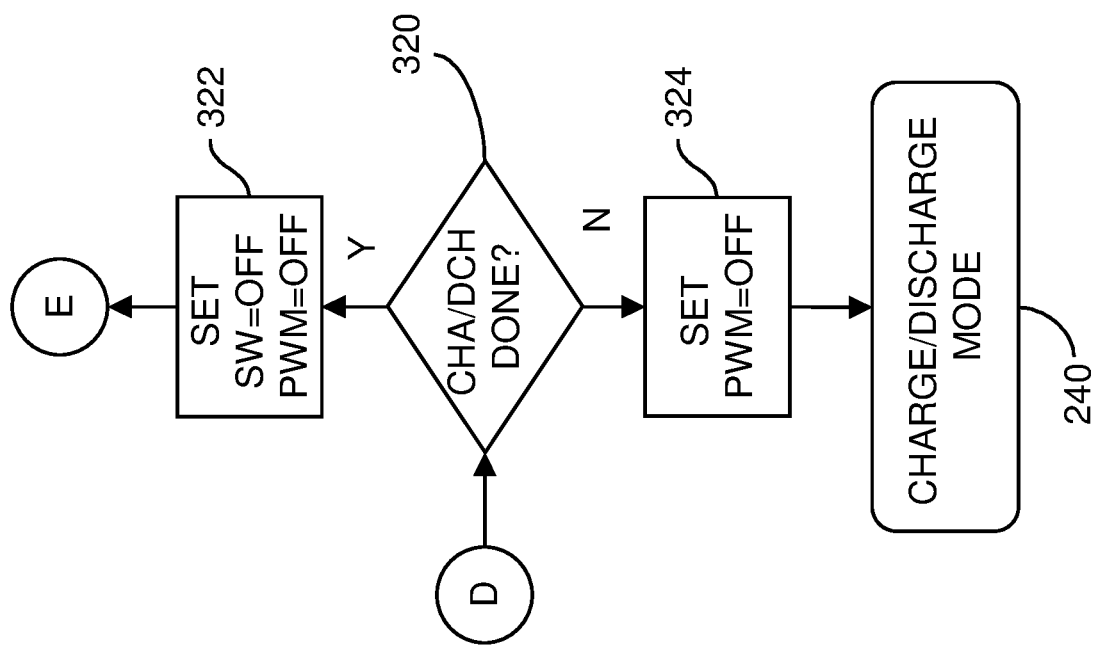

When the fault ends or is not detected, step 208, then the BMS waits for a mode change instruction or request from either a user or from a higher-level system, step 210, which is idle mode. The mode change request is parsed to determine which mode is requested. When charge or discharge mode is requested, step 210, the charge/discharge mode routine 240 is activated (FIG. 4B). When charge or discharge mode with online inspection is requested, step 210, the charge/discharge with online inspection mode routine 280 is activated (FIG. 4D-4F). When idle mode with online inspection is requested, step 210, the idle with online inspection mode routine 260 is activated (FIG. 4C).

In FIG. 4B, charge/discharge mode routine 240 is activated. A current limit ILIM for battery pack 40 is set, step 243. MCU 10 drives SW high to turn on power switch 30 to allow battery pack 40 to be charged by an external charger, or to drive an external load. MCU 10 does not pulse PWM, which is off, step 246. The DC load current IL is the same as the battery current and is read, step 242, such as by using synchronous sampling 22.

When the load current IL exceeds the current limit ILIM, step 244, alarm sub-program 220 (FIG. 4A) is activated to prevent damage to battery pack 40 caused by the high load current. When the load current does not exceed the current limit, step 244, then the BMS waits for charging and discharging to finish, step 248. After charging and discharging is done, step 248, charge/discharge mode ends and SW is turned off, step 252. The process loops back to step 210 in FIG. 4A.

In FIG. 4C, idle with online inspection mode routine 260 is activated. Parameters for the frequency sweep of PWM_IN are initialized, step 262. These parameters can include a starting maximum frequency, an ending minimum frequency, and a frequency step. MCU 10 keeps SW off to idle battery pack 40, but enables pulsing of PWM, step 266. MCU 10 drives PWM_IN with the starting maximum frequency, causing on-board excitation regulator 50 to drive an alternating current to limited energy unit 60 with the maximum frequency of PWM_IN. This frequency sweep excitation 270 continues for a period of time such as 3 cycles at the maximum frequency. At the end of the time period, the frequency is checked, and when the frequency is not at the ending minimum frequency, step 268, the frequency of PWM_IN is reduced by the frequency step, step 274.

MCU 10 then drives PWM_IN with the new, lower frequency, causing on-board excitation regulator 50 to drive limited energy unit 60 at a lower frequency, which then excites battery pack 40 at a lower frequency. Battery voltage VB, battery current IB, and internal nodes may be read by synchronous sampling 22.

Frequency sweep excitation 270 continues at the lower frequency for the period of time until the frequency is again checked, step 268, and stepped down again, step 274 to sweep the frequency lower. After several loops the frequency of PWM_IN is swept down to the ending minimum frequency. Then after frequency sweep excitation 270 at this minimum frequency, the minimum frequency is detected, step 268, and the frequency sweep loop is exited. MCU 10 turns PWM off, step 272, and idle with online inspection mode routine 260 ends.

In FIG. 4D, charge/discharge with online inspection mode routine 280 is activated. A current limit ILIM for battery pack 40 is set, step 283. Parameters for the frequency sweep of PWM_IN are initialized, step 282. MCU 10 drives SW high to turn on power switch 30 to allow battery pack 40 to be charged by an external charger, or to drive an external load. MCU 10 turns PWM on and begins pulsing PWM_OUT, step 286. The DC load current IL is read, step 288. When the load current IL exceeds the current limit ILIM, step 284, alarm sub-program 220 (FIG. 4A) is activated to prevent damage to battery pack 40 caused by the high load current.

When the load current does not exceed the current limit, step 284, charge/discharge with online inspection mode routine 280 continues in FIG. 4E.

MCU 10 drives PWM_IN with the starting maximum frequency, causing on-board excitation regulator 50 to drive an alternating current to limited energy unit 60 with the maximum frequency of PWM_IN. Frequency sweep excitation 270 continues for a period of time. After this time period, when charging and discharging is done but the ending minimum frequency has not yet been reached, step 310, MCU 10 turns off SW to turn off power switch 30 and disconnect battery pack 40 from an external charger or load, step 314. Then the frequency of PWM_IN is reduced by the frequency step, step 278, and frequency sweep excitation 270 is repeated with the lower frequency.

When charging and discharging is not done and the ending minimum frequency has not yet been reached, step 312, the frequency of PWM_IN is reduced by the frequency step, step 276, and the load current IL is read, step 288 (FIG. 4D), and compared to ILIM, step 284, allowing alarm sub-program 220 (FIG. 4A) to be called when the load current exceeds the current limit ILIM. Otherwise, frequency sweep excitation 270 is repeated with the lower frequency, and the loop continues and is repeated for successively lower frequencies of PWM_IN.

When the current frequency reaches the minimum frequency, step 312, in FIG. 4E, when charging and discharging is not yet done, step 320, FIG. 4F, then MCU 10 turns PWM off and stops pulsing PWM_OUT, step 324, and BMS continues in charge/discharge mode routine 240.

When the current frequency reaches the minimum frequency, step 312, and the charging and discharging is done, step 320, then MCU 10 turns PWM off and stops pulsing PWM_OUT, and turns SW off, step 322, to idle the BMS.

Figure 5:
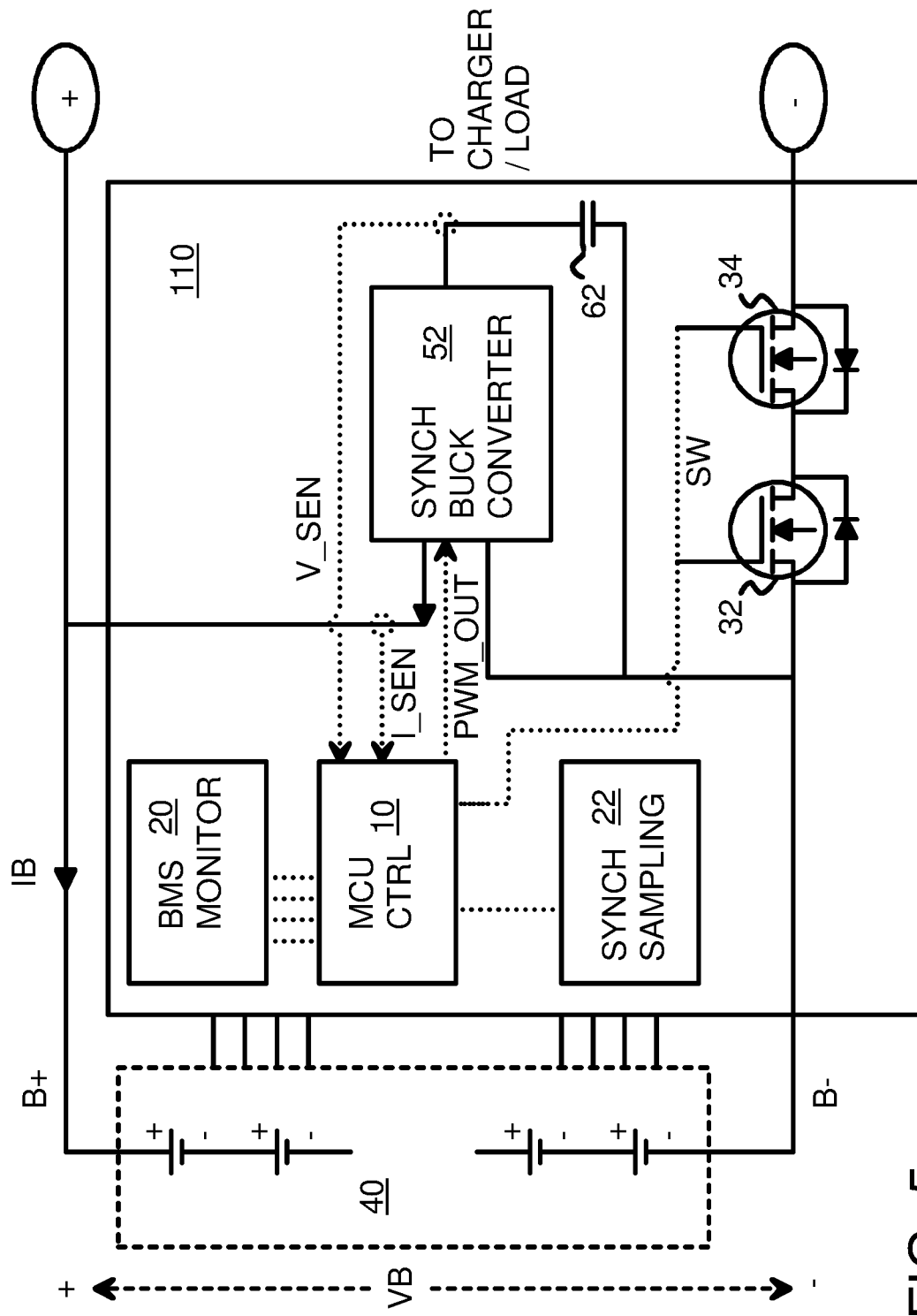
FIG. 5 shows a capacitor being used for a limited energy unit driven by a buck converter.

FIG. 5 shows a capacitor being used for a limited energy unit driven by a buck converter. BMS with AC impedance inspector 110 has synchronous buck converter 52 that receives the PWM_OUT signal from MCU 10 and excites capacitor 62 with a frequency determined by PWM_IN. The varying voltage V_SEN of capacitor 62 is amplified by synchronous buck converter 52 to drive excitation current I_SEN to battery terminal B+ to excite battery pack 40 during AC impedance inspection. I_SEN is an AC signal generated in response to driving capacitor 62 with the frequency of PWM_IN.

MCU 10 monitors V_SEN and I_SEN, which is the stimulus applied to battery pack 40 during AC impedance inspection. MCU 10 also monitors the response by battery pack 40 to this stimulus, using BMS monitor 20 and synchronous sampling 22. For example, the response of battery pack 40 can be determined by small AC changes in the overall battery voltage VB or of voltages on internal nodes in battery pack 40. Overall battery current IB and voltage VB, or internal nodes in battery pack 40, are monitored by synchronous sampling 22.

Power switch 30 is implemented by Gallium-Nitride (GaN) transistors 32, 34 that are controlled by SW. GaN transistors can carry very large power currents yet can switch quickly.

During charging mode, when the external charger charges battery pack 40, capacitor 62 is also charged. Capacitor 62 stores a sufficient charge to generate the AC excitation signal through synchronous buck converter 52 for the frequency sweep range. Capacitor 62 can have a capacitance of 1 mF/100V.

Capacitor 62 can be pre-charged by battery pack 40. Capacitor 62 is pre-charged to a DC voltage through synchronous buck converter 52 when PWM is on and MCU 10 drives a DC signal to PWM_IN. Capacitor 62 then operates with a small AC voltage/current ripple to generate AC excitation signal I_SEN through synchronous buck converter 52. Synchronous buck converter 52 produces AC excitation I_SEN and injects it to battery pack 40, without drawing energy from battery pack 40.

Figure 6:
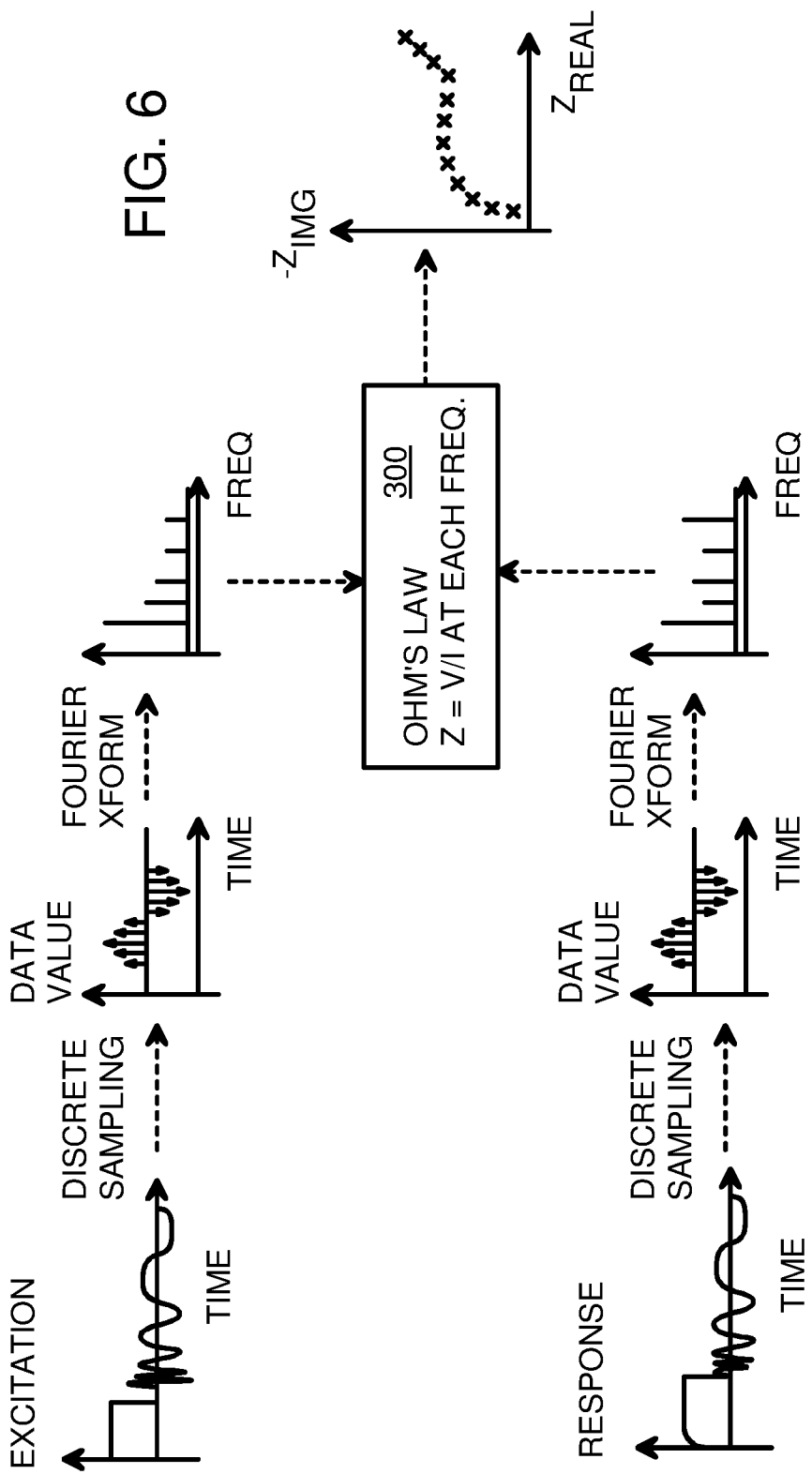
FIG. 6 highlights processing of the AC excitation signal and the response from the battery pack.

FIG. 6 highlights processing of the AC excitation signal and the response from the battery pack. The AC excitation signal applied to battery pack 40, such as current I_SEN, causes a time-varying response for battery pack 40, such as battery voltage VB.

Capacitances within battery pack 40 can introduce a 90-degree phase shift in the response voltage relative to the AC excitation signal current. This phase shift can be described using imaginary numbers, as an imaginary part of impedance Z.

Both the excitation and response waveforms are processed by discrete sampling to generate data values, which are then processed by Fourier transforms to generate frequency plots or bins in the frequency domain. The excitation frequency plot is derived from current values, while the response frequency plot is derived from voltage values.

Using Ohm's law for impedance Z=V/I for each frequency bin, the real and imaginary parts of the impedance are plotted as a Nyquist plot. A Digital Signal Processor (DSP) or other processor can implement Ohm's law calculator 300.

The excitation current I_SEN and voltage response VB at each instance of time are sampled synchronously with the timing sequences captured by synchronous sampling 22. After Fourier transforms, the amplitude and phase data for excitation and response at different frequencies can be found. Amplitudes of VB and I_SEN and their phase angles can then be used to calculate the complex impedance Z, which is represented in the form of real and imaginary parts.

Figure 7:
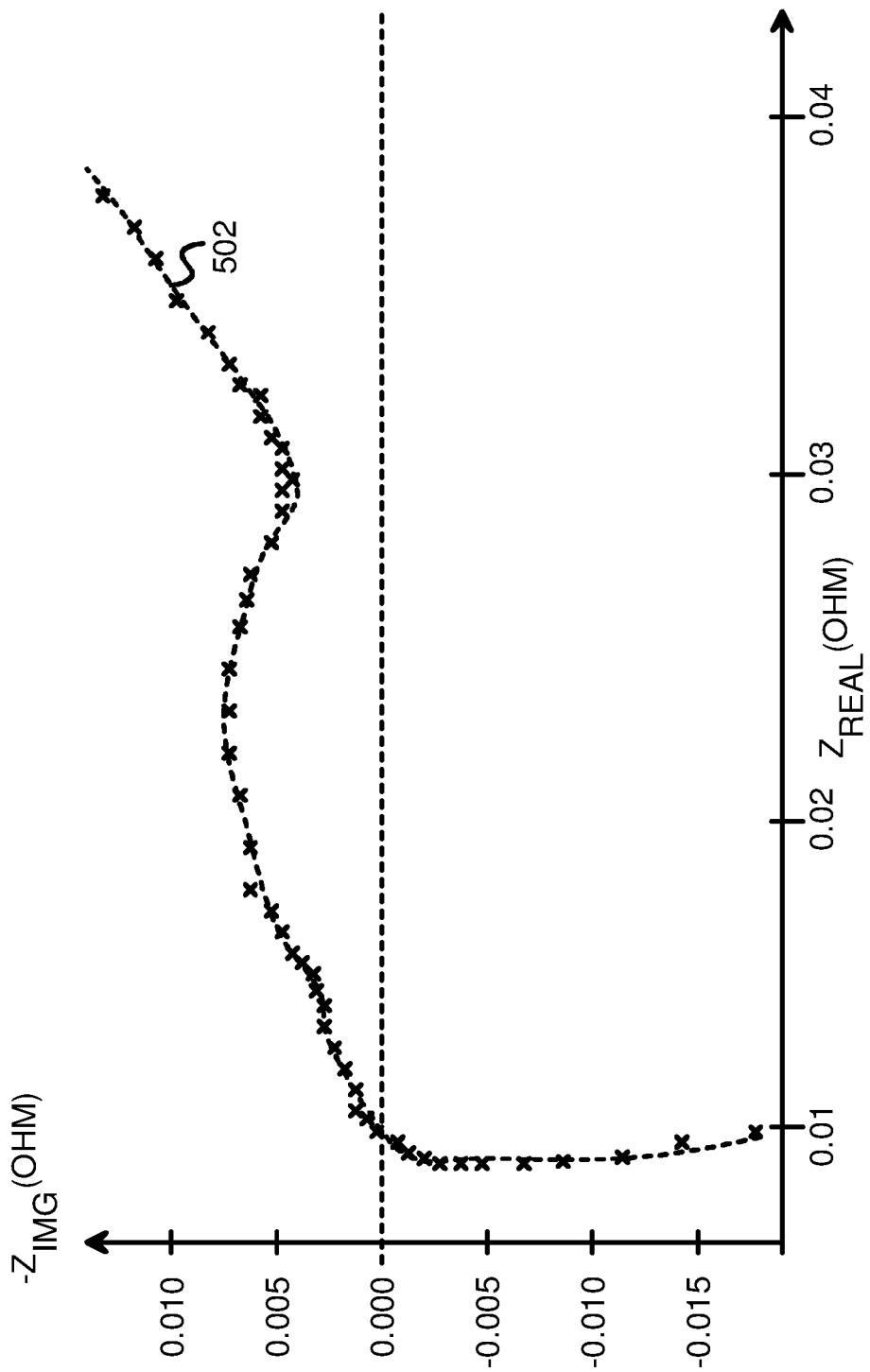
FIG. 7 is a Nyquist plot generated from AC impedance inspection of a battery using an on-board excitation regulator with a limited energy unit.

FIG. 7 is a Nyquist plot generated from AC impedance inspection of a battery using an on-board excitation regulator with a limited energy unit. The imaginary and real parts of each impedance value are plotted to form curve 502. Each data point corresponds to a frequency. Higher frequency data points tend to be on the left and lower frequencies on the right.

At high frequencies, the impedance reflects the battery ohmic resistance of the electrolyte. At middle frequencies, the impedance is affected by SEI capacitance and electron transfer rate. At lower frequencies, the impedance reflects the diffusion processes of conductive ions in the electrode material.

The shape of curve 502 varies with the electrochemical responses of battery electrochemical cells, as well as internal resistances and capacitances within the battery. As the battery ages and wears, the shape of 502 will change.

Figure 8:
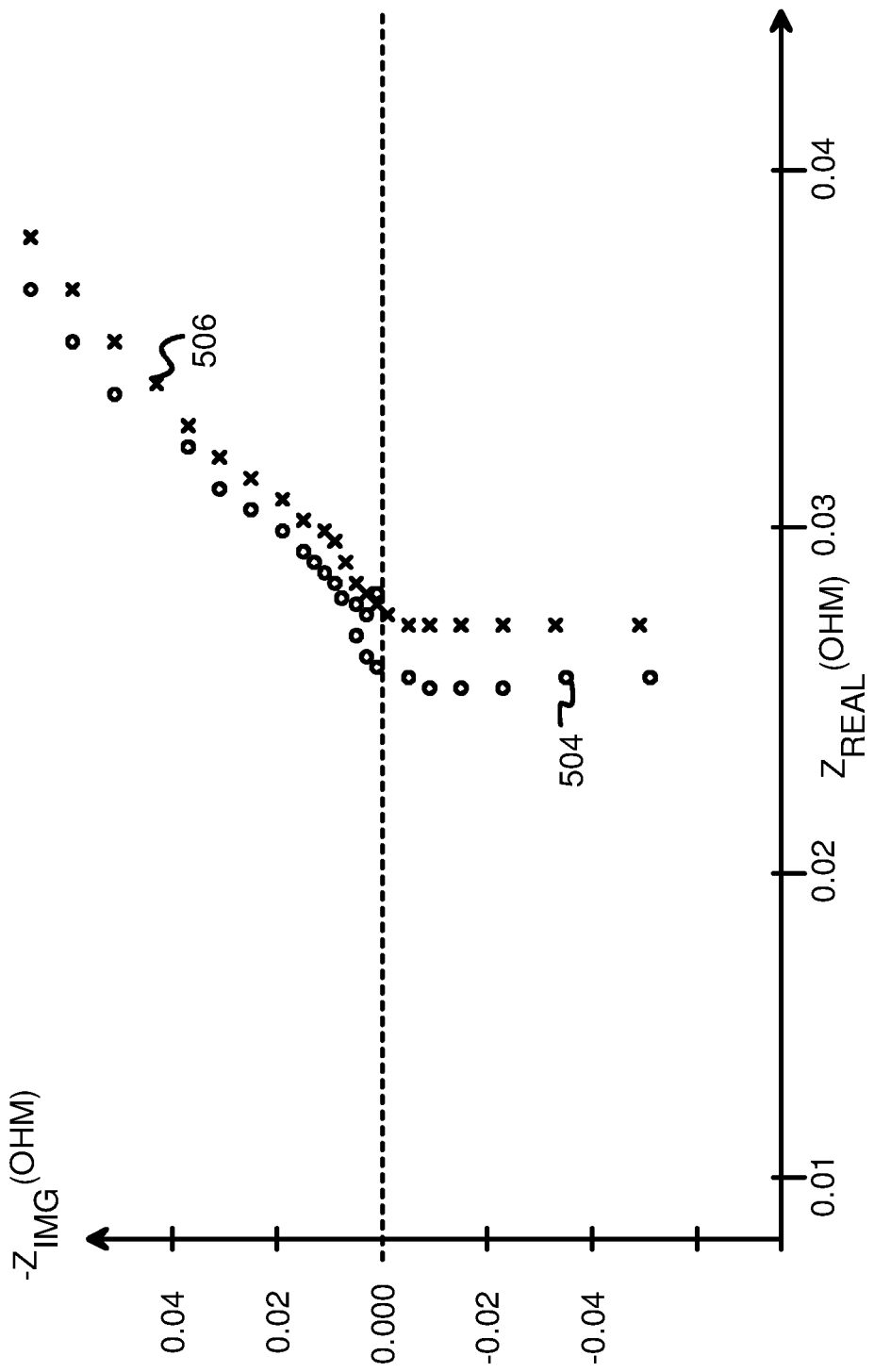
FIG. 8 is a Nyquist plot generated from AC impedance inspection of a battery cell using an on-board excitation regulator with a limited energy unit.

FIG. 8 is a Nyquist plot generated from AC impedance inspection of a battery cell using an on-board excitation regulator with a limited energy unit. The imaginary and real parts of each impedance value are plotted. Curve 504 is for a new battery cell while curve 506 is for an older battery cell. The older battery has curve 506 that is shifted to the right compared with new battery curve 504. The age or wear of a battery being inspected can be estimated by the shift in its curve relative to the curve for a new battery. While the age estimation may not be precise, even a rough age estimation for the battery can be useful.

Figure 9:
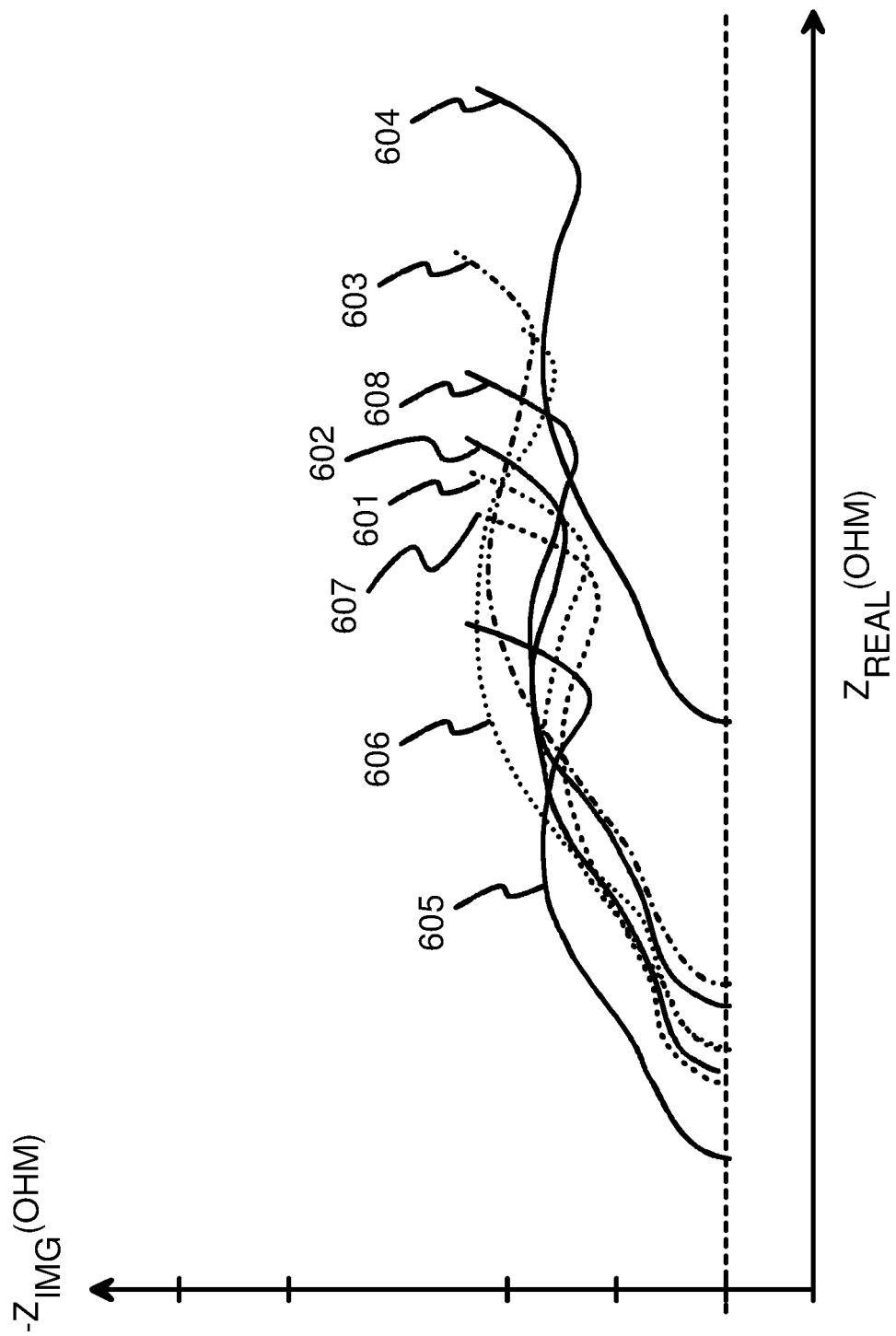
FIG. 9 is a Nyquist plot generated from AC impedance inspection of a battery pack using an on-board excitation regulator with a limited energy unit.

FIG. 9 is a Nyquist plot generated from AC impedance inspection of a battery pack using an on-board excitation regulator with a limited energy unit. The imaginary and real parts of each impedance value are plotted. Synchronous sampling 22 can sample several internal nodes between battery modules that are connected in series within battery pack 40. The voltage from each internal node can be separately sampled and processed to create one of curves 601-608.

Curves 601-608 are for different battery modules in a battery pack. In particular, curve 604 is shifted to the right more than other curves 601, 602, 603, 605, 606, 607, 608. This right-shift of curve 604 indicates that the battery module that created curve 604 has greater wear than the other battery modules. The BMS could instruct battery pack 40 to disconnect the battery module corresponding to curve 604. The lifetime of battery pack 40 may be increased by disconnecting worn battery modules within battery pack 40.

Figure 10:
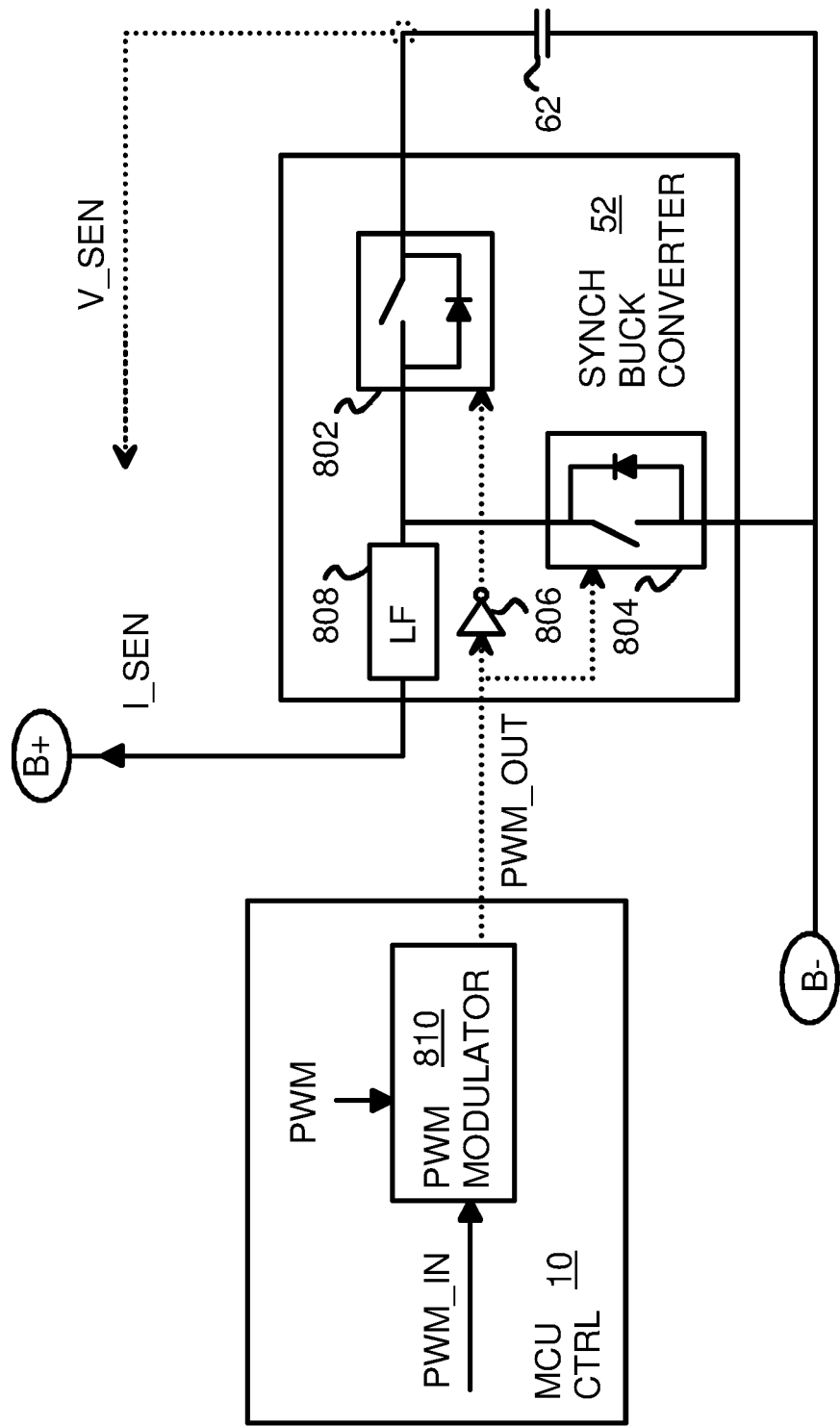
FIG. 10 shows a synchronous buck converter generating an excitation signal from energy stored by a capacitor.

FIG. 10 shows a synchronous buck converter generating an excitation signal from energy stored on a capacitor. Capacitor 62 is initially pre-charged when PWM turns on. Capacitor 62 is pre-charged by a limited current drawn from battery pack 40 through the synchronous buck converter. The voltage of capacitor 62 is sampled and fed back to MCU 10 as V_SEN. After V_SEN reaches a preset value, which can be controlled by MCU 10, pre-charge stops. Capacitor 62 later supplies energy for synchronous buck converter 52 to generate excitation current I_SEN.

Capacitor 62 is driven directly by synchronous buck converter 52. MCU 10 enables PWM modulator 810 when enable signal PWM is on, with PWM_IN controlling the frequency of output PWM_OUT generated by PWM modulator 810.

Synchronous buck converter 52 has switch 802 enabled by inverter 806 to conduct current when PWM_OUT is low, while switch 804 is enabled to conduct current when PWM_OUT is high. Filter 808 can be a current filter such as an inductor that carries excitation current I_SEN between battery terminal B+ of battery pack 40 and switches 802, 804. Negative battery terminal B_ connects to switch 804 and capacitor 62, while switch 802 drives the upper terminal of capacitor 62 to generate voltage V_SEN.

When switch 802 is on and switch 804 is off, current is supplied from capacitor 62 through switch 802 and current filter 808 to supply the excitation current I_SEN to battery pack 40 on battery terminal B+. When switch 802 is off and switch 804 is on, capacitor 62 supplies excitation current I_SEN through switch 804 and current filter 808 to battery terminal B+. Switches 802, 804 are unidirectional switches.

Alternate Embodiments

Several other embodiments are contemplated by the inventors. For example other circuits may be used for on-board excitation regulator 50, such as synchronous buck converter 52, buck-boost, half-bridge, full bridge, multi-level flyback converter, bidirectional DC-DC/DC-AC converters, or any circuits that can produce a variable frequency excitation signal. On-board excitation regulator 50 can be connected between terminals B+ and B− of battery pack 40 to draw power from battery pack 40 directly, or there may be a power controller mounted on a Printed Circuit Board (PCB) for BMS with AC impedance inspector 100 that draws power from terminals B+ and B− of battery pack 40 and then powers on-board excitation regulator 50 and MCU 10 and other components with a local power supply that is derived from battery pack 40, or from the external charger during charger mode.

MCU 10 gets power from terminals B+ and B−, either draining from battery pack 40 during AC inspection mode without an external charger connected, or from the external charger during charger mode. MCU 10 consumes power continuously. On-board excitation regulator 50 consumes no battery power since it transfers an AC current between battery pack 40 and capacitor 62 after capacitor 62 is precharged. Capacitor 62 is used to store the limited energy drawn from battery pack 40 during the precharge process. The energy stored in capacitor 62 is lossless.

Capacitor 62 could be an ultra capacitor or a standard capacitor, using a variety of technologies. Synchronous sampling 22 may have one or more Analog-to-Digital Converters (ADCs) to accurately measure voltage or currents in battery pack 40.

Calibration tables can be constructed by aging cycling of new batteries with repeating AC impedance inspection over the battery aging to develop battery curves on Nyquist plots or similar data tables. The State of Health (SOH) of a battery may be estimated based on curves obtained for battery thus aged. Various models of battery pack 40 could be used, such as having capacitances and resistances in parallel and series networks. Various Electrochemical Impedance Spectroscopy (EIS) models may be used to interpret curve shifts on Nyquist plots obtained by the BMS. Bode plots may also be used.

While plotting of imaginary and real parts of impedance values has been described, this plotting may be tabulating the impedance data in a computer memory and does not require creating a graph that can be seen by humans. The plot may be various tables of data in the computer memory rather in various formats and arrangements. The BMS may detect curve shifts by looking at impedance values along curves that intersect a line, rather than examining the entire curve. The curve shift may be detected as different intersection values.

The time between frequency steps can be sufficiently long for a steady-state to be reached with the components inside battery pack 40 to potentially resonate with the applied AC excitation signal. The duration can last for tens of cycles of AC excitation signal I_SEN, which can be set by MCU 10.

While a Pulse-Width Modulation (PWM) input signal PWM_IN has been described, this PWM_IN signal could have a variety of wave-shapes and forms, such as square, rectangular, triangle, sine, and other shapes, and can have various duty cycles and phases.

While a current I_SEN has been described as the AC excitation signal and a voltage has been described as the response, the AC excitation signal could be a modulated voltage applied to B+ while the response could be a current through battery pack 40. The response could be voltages taken from internal nodes within battery pack 40 or from the battery terminal B+, or could be internal currents sensed by battery pack 40, and could also be various combinations. BMS with AC impedance inspector 100 could examine several nodes for responses and then combine these responses or separately analyze each response. For example, battery pack 40 could have several battery modules in series, and battery pack 40 could detect internal voltages of nodes between internal battery modules and report these internal voltages to synchronous sampling 22. Each internal node's voltage could be processed as shown in FIG. 6 as a function of frequency and the AC excitation signal and plotted as a separate curve on the Nyquist plot. Each of curves 601-608 could be for a different battery module within battery pack 40. A small shift among curves could be due to different series resistances to B− among the battery modules connected in series.

Synchronous sampling 22, BMS monitor 20, MCU 10, balance circuit 24, on-board excitation regulator 50, limited energy unit 60 could be implemented in various ways. MCU 10 may execute instructions to implement the process of FIGS. 4A-4F, but some steps could use hardware engines, and the instructions could be combinations of firmware, software, and hardware logic. A Digital Signal Processor (DSP) or other processor could be called by MCU 10 to perform more complex processing, such as the Fourier transforms shown in FIG. 6. MCU 10 could also be integrated with a DSP.

With the same excitation current I_SEN, individual battery cells within battery pack 40 may behave differently and present different voltages in response. Their voltages are sampled by synchronous sampling 22 that measures voltages of internal nodes. One frequency corresponds to the whole battery pack with every cell connected in series. Battery pack 40 could contain several battery modules in series, and each battery module could contain several battery cells in series or in parallel or in various combinations. Other arrangements are possible Power switch 30 has been shown with one implementation using a pair of Gallium Nitride (GaN) transistors. Many other switch implementations and technologies may be substituted. Power switch 30 could be relocated to connect the+terminal rather than the—terminal of the external charger/load.

Rather than have a single power switch on the power return line to the B− terminal of battery pack 40, separate power switches may be used, one switch between B− and the—node of the external charger, and another switch between B− and the—node of the external load. Then MCU 10 can select the switch to the charger for charging mode and the switch to the load for discharge mode. While charge/discharge has been shown as a combined node in the process of FIGS. 4A-4F, the process could have separate charge and discharge modes, with and without online inspection, for a total of 4 modes rather than 2 modes as shown in FIGS. 4A-4F.

Other components such as resistors, inductors, capacitors, fuses, filters, switches, transistors, etc. may be added at various nodes for various reasons. A PCB implementing BMS with AC impedance inspector 100 would typically have other components such as filter capacitors, buffers, power controllers or regulators, clock generators, etc.

While a downward frequency sweep has been described, an upward frequency sweep could be substituted. The size of the frequency step could be varied. The frequency could be changed from among a list of discrete frequencies to implement the sweep.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A battery manager-inspector comprising:
a first battery connection for connecting to a first terminal of a battery pack;
a second battery connection for connecting to a second terminal of a battery pack;
a first external connector for connecting to a first terminal of an external charger and to a first terminal of an external load;
a second external connector for connecting to a second terminal of the external charger and to a second terminal of the external load;
a power switch connected between the second external connector and the second battery connection, the power switch disconnecting the second external connector from the second battery connection in response to a switch signal being in an inactive state;
a controller driving the switch signal into an active state to cause the power switch to connect the second external connector to the second battery connection when a charge/discharge mode is active, and driving the switch signal to the inactive state when an idle mode is active;
a modulation signal generated by the controller that modulates during battery inspection, wherein the controller changes a frequency of the modulation signal over a group of frequencies;
a limited energy unit that stores a limited energy that is insufficient to power the battery manager-controller, wherein the limited energy is sufficient to generate an AC excitation signal;
an on-board excitation regulator that receives the modulation signal from the controller and drives the limited energy unit with the modulation signal to cause the limited energy unit to modulate to create the AC excitation signal;
wherein the AC excitation signal has modulations having a frequency of the modulation signal;
the on-board excitation regulator injecting the AC excitation signal into the first battery connection during battery inspection;
wherein the modulations of the AC excitation signal injected into the battery pack causes response modulations in a response signal in the battery pack; and
a synchronous sampler that samples the response signal in the battery pack and detects the response modulations;
wherein the limited energy unit is a capacitor;
wherein the capacitor is connected between a first output node of the on-board excitation regular and the second battery connection;
whereby the AC excitation signal is generated from the limited energy unit.

2. The battery manager-inspector of claim 1 wherein a second output node of the on-board excitation regulator is directly connected to the first battery connection;
wherein modulation of the capacitor creates the AC excitation signal.

3. A battery manager-inspector comprising:
a first battery connection for connecting to a first terminal of a battery pack;
a second battery connection for connecting to a second terminal of a battery pack;
a first external connector for connecting to a first terminal of an external charger and to a first terminal of an external load;
a second external connector for connecting to a second terminal of the external charger and to a second terminal of the external load;
a power switch connected between the second external connector and the second battery connection, the power switch disconnecting the second external connector from the second battery connection in response to a switch signal being in an inactive state;
a controller driving the switch signal into an active state to cause the power switch to connect the second external connector to the second battery connection when a charge/discharge mode is active, and driving the switch signal to the inactive state when an idle mode is active;
a modulation signal generated by the controller that modulates during battery inspection, wherein the controller changes a frequency of the modulation signal over a group of frequencies;
a limited energy unit that stores a limited energy that is insufficient to power the battery manager-controller, wherein the limited energy is sufficient to generate an AC excitation signal;

an on-board excitation regulator that receives the modulation signal from the controller and drives the limited energy unit with the modulation signal to cause the limited energy unit to modulate the create the AC excitation signal;
wherein the AC excitation signal has modulations having a frequency of the modulation signal;
the on-board excitation regulator injecting the AC excitation signal into the first battery connection during battery inspection;
wherein the modulations of the AC excitation signal injected into the battery pack causes response modulations in a response signal in the battery pack; and
a synchronous sampler that samples the response signal in the battery pack and detects the response modulations, whereby the AC excitation signal is generated from the limited energy unit;
wherein the limited energy unit is a capacitor;
wherein the on-board excitation regulator is a synchronous buck converter.

4. The battery manager-inspector of claim 3 wherein the controller modulates the modulation signal during the charge/discharge mode when battery inspection is requested;
wherein the controller modulates the modulation signal during the idle mode when battery inspection is requested;
wherein online battery inspection is able to be performed during charging of the battery pack, during discharging of the battery pack, and when the battery pack is idle.

5. The battery manager-inspector of claim 3 further comprising:
an AC impedance processor that examines the response modulations from the battery pack and the modulations of the AC excitation signal to generate an impedance plot;
wherein the impedance plot is a plot of an imaginary part of an impedance to a real part of an impedance, the impedance plot being a Nyquist plot.

6. The battery manager-inspector of claim 5 wherein battery aging is signaled when a shift of a curve in the impedance plot is detected by the AC impedance processor.

7. The battery manager-inspector of claim 5 wherein the AC impedance processor further comprises:
a first discrete sampler for sampling the AC excitation signal to generate a sampled AC excitation signal;
a first transformer for Fourier transforming the sampled AC excitation signal to generate excitation frequency bins in a frequency domain;
a second discrete sampler for sampling the response signal to generate a sampled response signal;
a second transformer for Fourier transforming the sampled response signal to generate response frequency bins in the frequency domain;
an impedance calculator, that for each frequency bin, dividing the response frequency bins by the excitation frequency bins to generate real and imaginary parts of impedance values;
a plotter for plotting the real and imaginary parts of impedance values onto the impedance plot;
wherein the impedance plot is a table of impedance values stored in a computer memory.

8. The battery manager-inspector of claim 5 wherein the on-board excitation regulator is connected between the first battery connection and the second battery connection;
wherein the on-board excitation regulator drives the AC excitation signal generated by the limited energy unit onto the first battery connection.

9. The battery manager-inspector of claim 5 wherein the AC excitation signal is a current injected into the first battery connection;
wherein the response signal is a voltage of the battery pack.

10. The battery manager-inspector of claim 9 wherein the response signal is a voltage of an internal node within the battery pack, the internal node being between the first battery connection and the second battery connection and having a different voltage than the first battery connection and than the second battery connection.

11. The battery manager-inspector of claim 4 further comprising:
a fuse connected between the first external connector and the first battery connection.

12. The battery manager-inspector of claim 4 further comprising:
a battery monitor for receiving a monitor signal from the battery pack;
wherein the controller executes an alarm routine in response to the monitor signal indicting a battery problem, the alarm routine causing the controller to drive the switch signal into the inactive state and causing the controller to stop modulating the modulation signal.

13. The battery manager-inspector of claim 4 further comprising:
an AC excitation current sensor, for sensing a value of the AC excitation signal injected as a current to the first battery connection;
wherein the controller samples the AC excitation signal using the AC excitation current sensor.

14. The battery manager-inspector of claim 13 further comprising:
a load/charge current sensor for sensing a load current from the battery pack to the external load or for sensing a charge current from an external charger to the battery pack;
wherein the controller compares the load current or the charge current sensed by the load/charge current sensor to a current limit and activates the alarm routine when the load current exceeds the current limit.

15. A battery manager and Alternating Current (AC) impedance inspector comprising:
a first terminal for connecting to a first terminal of a battery pack;
a second terminal for connecting to a second terminal of the battery pack;
a power switch for connecting the second terminal to a second external terminal when a switch signal is active, and for isolating the second terminal from the second external terminal when the switch signal is not active;
wherein an external charger is able to be connected to the second external terminal and to the first terminal to charge the battery pack;
wherein an external load is able to be connected to the second external terminal and to the first terminal to be powered by the battery pack;
a sampler for receiving a battery test voltage from the battery pack;
a controller for driving the switch signal active during a charge/discharge mode and for driving the switch signal not active during an idle mode when the battery pack is not being charged and is not driving the external load;
the controller generating a modulation signal when inspecting the battery pack, the controller modulating the modulation signal with a swept frequency that is swept over a range of frequencies;

a capacitor;

a synchronous buck converter that is driven by the modulation signal to drive the capacitor with the range of frequencies of the modulation signal to generate an AC excitation signal having the range of frequencies of the modulation signal; and a first current sensor coupled between the synchronous buck converter and the first terminal;

wherein the synchronous buck converter drives the AC excitation signal as a first modulation current through the first current sensor;

wherein the first modulation current is modulated over the range of frequencies of the modulation signal;

wherein the battery pack responds to the first modulation current by modulating the battery test voltage;

wherein the sampler detects response modulations of the battery test voltage from the battery pack;

wherein the controller processes the response modulations and excitation modulations of the first modulation current to generate battery impedance data of the battery pack.

16. The battery manager and Alternating Current (AC) impedance of claim 15 further comprising:

a Pulse-Width Modulation (PWM) generator in the controller, the PWM generating the modulation signal as a Pulse-Width Modulated output signal in response to a PWM input signal from the controller.

17. A Battery Management System (BMS) with Alternating Current (AC) impedance inspection comprising:

a frequency sweeper for adjusting a frequency of a modulation signal over a range of test frequencies when a battery inspection mode is activated;

a capacitor;

a synchronous buck converter that modulates the capacitor with the modulation signal to generate an AC excitation current that is injected into a battery pack;

a current sensor that senses AC current values of the AC excitation current injected into the battery pack;

wherein the AC excitation current is modulated over the range of test frequencies by the synchronous buck converter;

a sampler that receives an AC test voltage of a node in the battery pack, the AC test voltage varying due to response of the battery pack to the AC excitation current;

an external connector for connecting to an external charger or to an external load;

a power switch between the battery pack and the external connector, the power switch connecting the battery pack to the external connector in response to a switch signal; and a controller for driving the switch signal active for a charge/discharge mode, and for driving the switch signal inactive for an idle mode;

wherein the controller activates the frequency sweeper during the battery inspection mode, which is able to occur during the charge/discharge mode and is able to occur during the idle mode;

wherein the AC current values and the AC test voltages are processable to form impedance values that indicate a state of health of the battery pack.

18. The BMS with AC impedance inspection of claim 17 wherein the synchronous buck converter further comprises:

a current filter connected between a first terminal of the battery pack and a first buck node;

a first unidirectional switch connected between the first buck node and a first terminal of the capacitor; and a second unidirectional switch connected between the first buck node and a second terminal of the battery pack;

wherein a second terminal of the capacitor is connected to the second terminal of the battery pack;

wherein the first unidirectional switch is enabled to conduct current when the modulation signal is in a first state;

wherein the second unidirectional switch is enabled to conduct current when the modulation signal is not in the first state.

* * * * *